(12) United States Patent
Cheng et al.

(10) Patent No.: US 8,582,379 B2
(45) Date of Patent: Nov. 12, 2013

(54) SINGLE ENDED SENSING SCHEME FOR MEMORY

(75) Inventors: Hong-Chen Cheng, Hsinchu (TW); Chih-Chieh Chiu, Toufen Township (TW); Chung-Ji Lu, Fongyuan (TW); Cheng Hung Lee, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 297 days.

(21) Appl. No.: 12/917,708

(22) Filed: Nov. 2, 2010

(65) Prior Publication Data

US 2012/0092939 A1    Apr. 19, 2012

Related U.S. Application Data

(60) Provisional application No. 61/394,159, filed on Oct. 18, 2010.

(51) Int. Cl.
*G11C 7/00*    (2006.01)

(52) U.S. Cl.
USPC .......................................................... 365/203

(58) Field of Classification Search
USPC .......................................................... 365/203
See application file for complete search history.

(56) References Cited

U.S. PATENT DOCUMENTS

| | | | |
|---|---|---|---|
| 2005/0052897 A1* | 3/2005 | Luk et al. ...................... | 365/149 |
| 2005/0110527 A1* | 5/2005 | Tam et al. ...................... | 327/51 |
| 2008/0278991 A1* | 11/2008 | Kajigaya ...................... | 365/149 |
| 2009/0168499 A1* | 7/2009 | Kushida et al. ............... | 365/156 |

* cited by examiner

*Primary Examiner* — Anthan Tran
(74) *Attorney, Agent, or Firm* — Lowe Hauptman & Ham, LLP

(57) ABSTRACT

A memory having a single-ended sensing scheme includes a bit line, a memory cell coupled to the bit line, and a precharge circuit. The precharge circuit is configured to precharge the bit line to a precharge voltage between a power supply voltage and a ground.

18 Claims, 4 Drawing Sheets

SINGLE ENDED SENSING SCHEME FOR MEMORY

CROSS-REFERENCE TO RELATED APPLICATIONS

The present application claims priority of U.S. Provisional Patent Application Ser. No. 61/394,159, filed on Oct. 18, 2010, which is incorporated herein by reference in its entirety.

TECHNICAL FIELD

The present disclosure relates generally to an integrated circuit, more particularly to a memory.

BACKGROUND

A conventional single-ended sensing circuit in a memory senses a full-swing (VDD-to-VSS/Ground) signal that varies in access time due to cell current variations. Access time performance is limited by a weak bit within a cell array. Reading data "0" (logical 0) discharges a bit line with a full swing from VDD to ground and pulls down a global bit line for the read output. The bit line pre-charges back to VDD after the read operation is completed, which costs dynamic power consumption.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
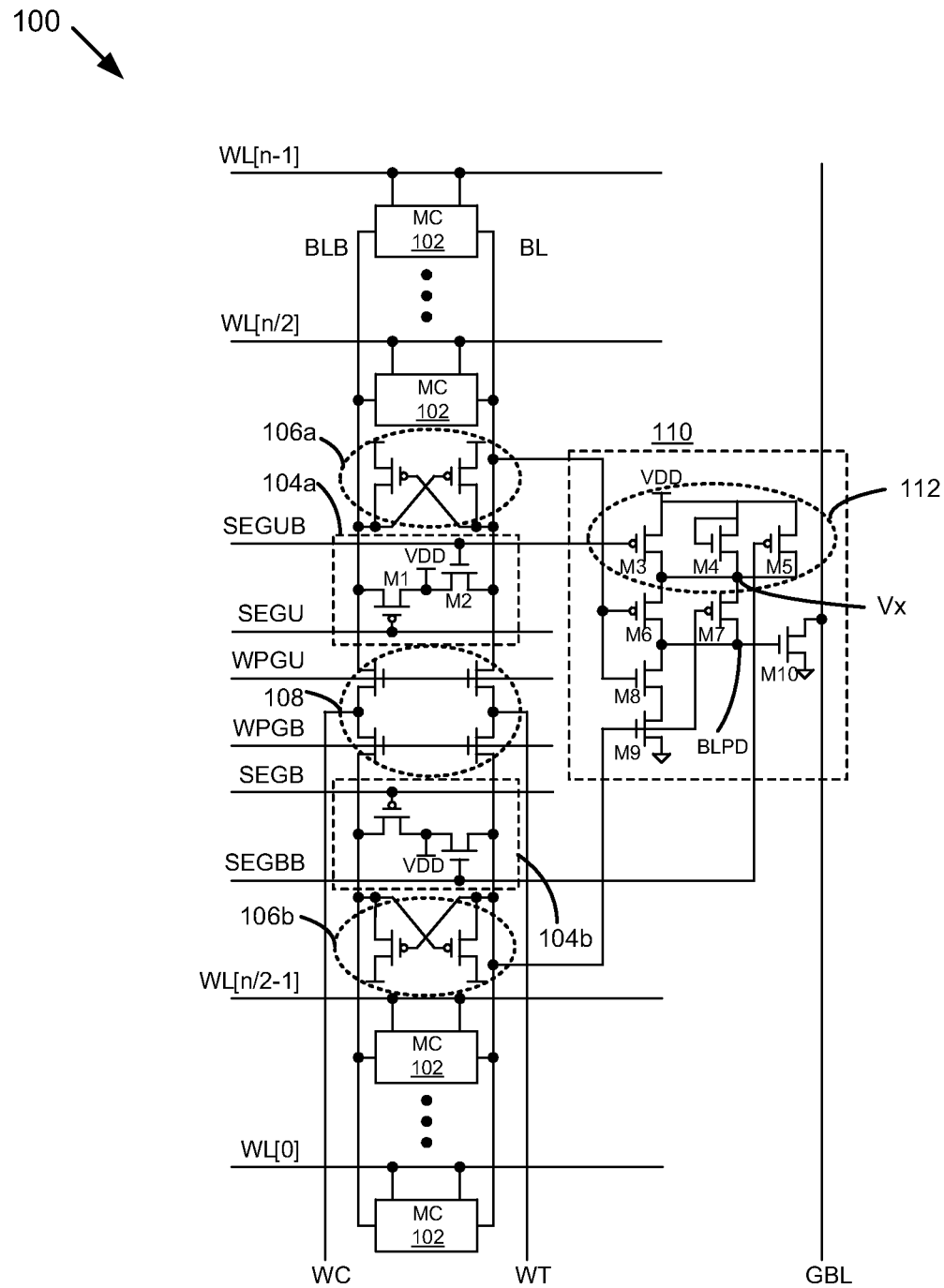
FIG. 1 is a schematic diagram of a portion of a memory showing an exemplary single-ended sensing scheme for the memory according to some embodiments.

FIG. 1 is a schematic diagram of a portion of a memory 100 showing an exemplary single-ended sensing scheme for the memory 100 according to some embodiments. The memory 100 includes memory cells 102 coupled to a bit line BL and a bit line bar BLB. Word lines WL[0], WL[2], . . . , and WL[n/2−1] are coupled to memory cells 102 in the bottom half of the memory 100, while word lines WL[n/2], WL[n/2+1], . . . , and WL[n−1] are coupled to memory cells 102 in the upper half of the memory 100. The upper and bottom halves of the memory 100 have symmetric structures, e.g., precharge circuits 104a and 104b have the same structures. Even though BL, BLB, and memory cells 102 in FIG. 1 are referring to common elements in both the upper half and lower half of the memory 100, a person skilled in the art will appreciate that the description below may use the upper half of the memory 100 as an example without losing generality.

Before reading operations, the precharge circuits 104a and 104b precharge BL and BLB for the upper and bottom halves of the memory cells 102 in the memory 100, respectively. The precharge circuit 104a includes a PMOS transistor M1 and an NMOS transistor M2. The source (or drain) of the PMOS transistor M1 is coupled to VDD, the drain (or source) of the PMOS transistor M1 is coupled to the BLB, and the gate of the PMOS transistor M1 is coupled to a precharge signal path SEGU. The source (or drain) of the NMOS transistor M2 is coupled to VDD, the drain (or source) of the NMOS transistor M2 is coupled to the BL, and the gate of the NMOS transistor M2 is coupled to a complement precharge signal path SEGUB.

When the precharge signal path SEGU has a voltage level at a logical 0, the PMOS transistor M1 is turned on to precharge BLB to VDD. At this time, the complement precharge signal path SEGUB has a voltage level at a logical 1, which turns on the NMOS transistor M2. The NMOS transistor M2 is diode-connected, because both its gate and source (or drain) are coupled to VDD (logical 1). The NMOS transistor M2 precharges BL to (VDD−Vthn), where Vthn is the threshold voltage of the NMOS transistor M2.

Pull-up circuits 106a and 106b (each having two cross-coupled PMOS transistors) pull up BL (from VDD−Vthn) to VDD while BL is reading "1" (logical 1), or while BLB is reading "0" (logical 0), for the upper and bottom halves of the memory cells 102 respectively. Write pass gate circuit 108 enable or disable writing to memory cells 102. A (single-ended) sensing circuit 110 is used to sense (or read) the BL and combines a NAND gate (formed by PMOS transistors M6, M7 and NMOS transistors M8, M9) and a voltage control circuit 112 that is connected to VDD. Instead of using both BL and BLB for sensing, the sensing circuit 110 uses one side (BL) for its sensing operation.

The voltage control circuit 112 includes one a diode coupled transistor, e.g., an NMOS transistor M4, and two PMOS transistors M3 and M5. The PMOS transistors M3 and M5 function as power switches controlled by precharge (complement) signal paths SEGUB and SEGBB, for the upper and bottom halves of the memory 100, respectively. By having a diode-coupled transistor M4, the voltage Vx at the drains of PMOS transistors M3 and M5 (or at the sources of PMOS transistors M6 and M7) is limited to (VDD−Vthm4) during precharging/stand-by (when the PMOS transistor M3 or M5 is not turned on), where Vthm4 is the threshold voltage of the diode-coupled transistor M4.

Thus, assuming Vthm4 is the same as Vthn, the voltage Vx is limited to (VDD−Vthn). This prevents turning on the PMOS transistor M6 (or M7) that has its gate coupled to the BL, when the BL is precharged to (VDD−Vthn). Without this voltage control of Vx at the sensing circuit 110, there could be a glitch in the read operation of the memory 100 and/or current leakage. Even though the NMOS transistor M4 is shown in FIG. 1, a different device, e.g., a diode-connected PMOS transistor can be used.

The NAND gate formed by PMOS transistors M6 and M7, and NMOS transistors M8 and M9, senses the value of BL and supply an output voltage at the node BLPD. When the read value is a logical 0, the output voltage at BLPD is pulled up to enable an NMOS transistor M10 that pulls down GBL to a logical 0. When the read value is a logical 1, the output voltage at BLPD is pulled down to disable the NMOS transistor M10 that leaves GBL at a logical 1.

Figure 2:
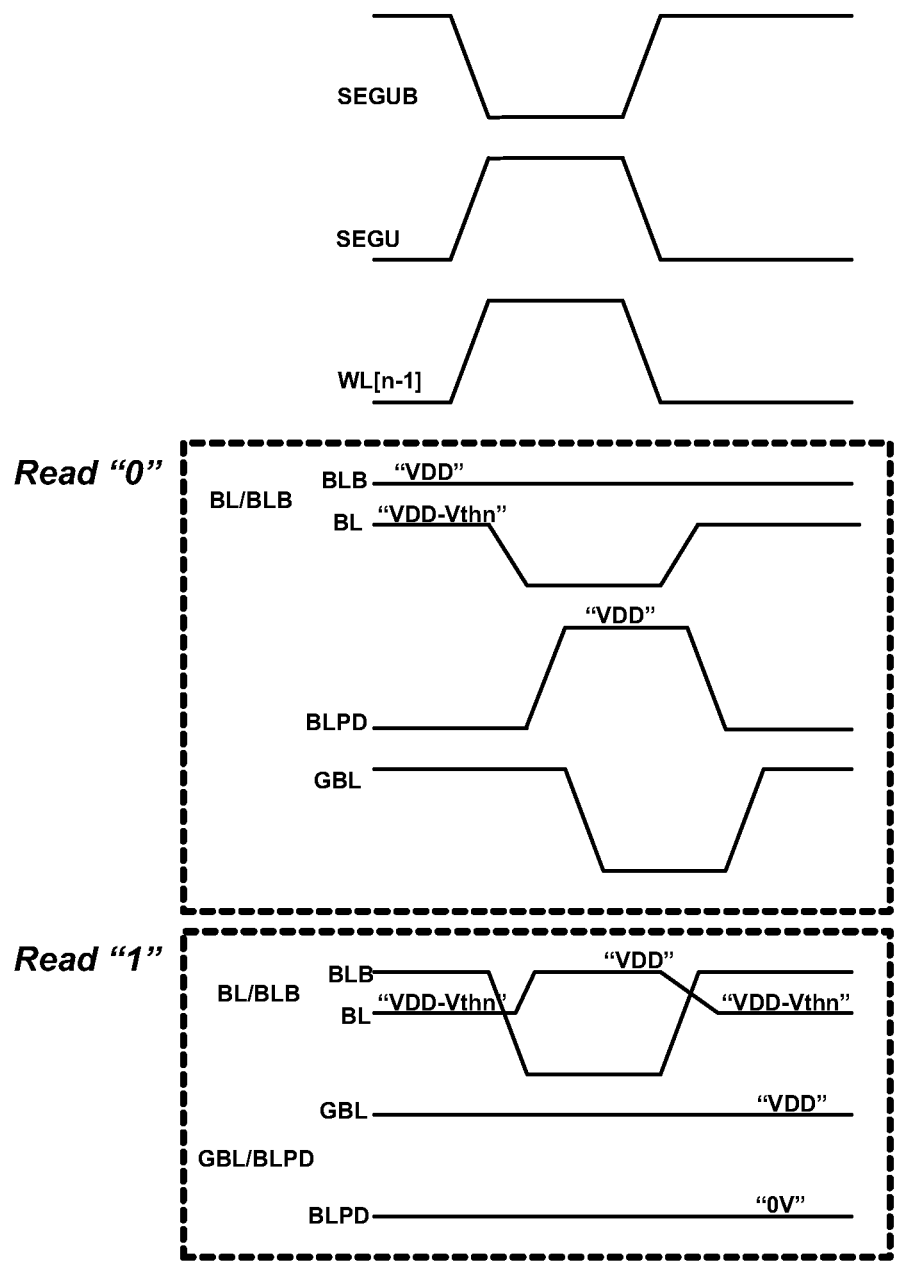
FIG. 2 is a plot showing waveforms of the exemplary single-ended sensing scheme of FIG. 1 according to some embodiments.

FIG. 2 is a plot showing waveforms of the exemplary single-ended sensing scheme of FIG. 1 according to some embodiments. For precharging, the precharge signal path SEGU has a voltage level at a logical 0 (e.g., ground) while complement precharge signal path SEGUB has a voltage level at a logical 1 (e.g., VDD). During precharging, BLB is precharged to VDD and BL is precharged to (VDD−Vthn) by the precharge circuit 104a. After the precharging, a word line signal path WL[n−1] is charged to have a logical 1 for the read operation. For a read "0" operation, BL is pulled down to a logical 0 (e.g., ground) while BLB is kept at a logical 1, as a logical 0 is read from the memory cell 102. The voltage output at the node BLPD is pulled up to VDD, which pulls down the global bit line GBL to a logical 0. After the read operation, BL and BLB are again precharged for the next read operation.

Since BL is precharged to (VDD−Vthn) instead of VDD, and then pulled down to a logical 0 (e.g., ground) for the read "0" operation, it takes less time compared to a full-swing pull-down from VDD to logical 0. Also, compared with a full-swing scheme, the lower voltage difference means the memory consumes less power. Thus, the read/access time, the standby power, and active power of the memory 100 are reduced. In at least one embodiment, the memory 100 showed: (1) a 5% access time improvement, (2) lower bit line leakage from the precharge circuit (e.g. 1~9% leakage reduction depending on bit cell storage data), (3) lower dynamic power for bit line charge back to (VDD−Vthn) after a read "0" operation (e.g., 2~5% active power reduction depending on the bit cell storage data and read/write pattern), over a memory having a full-swing BL/BLB charging/discharging scheme.

Figure 3:
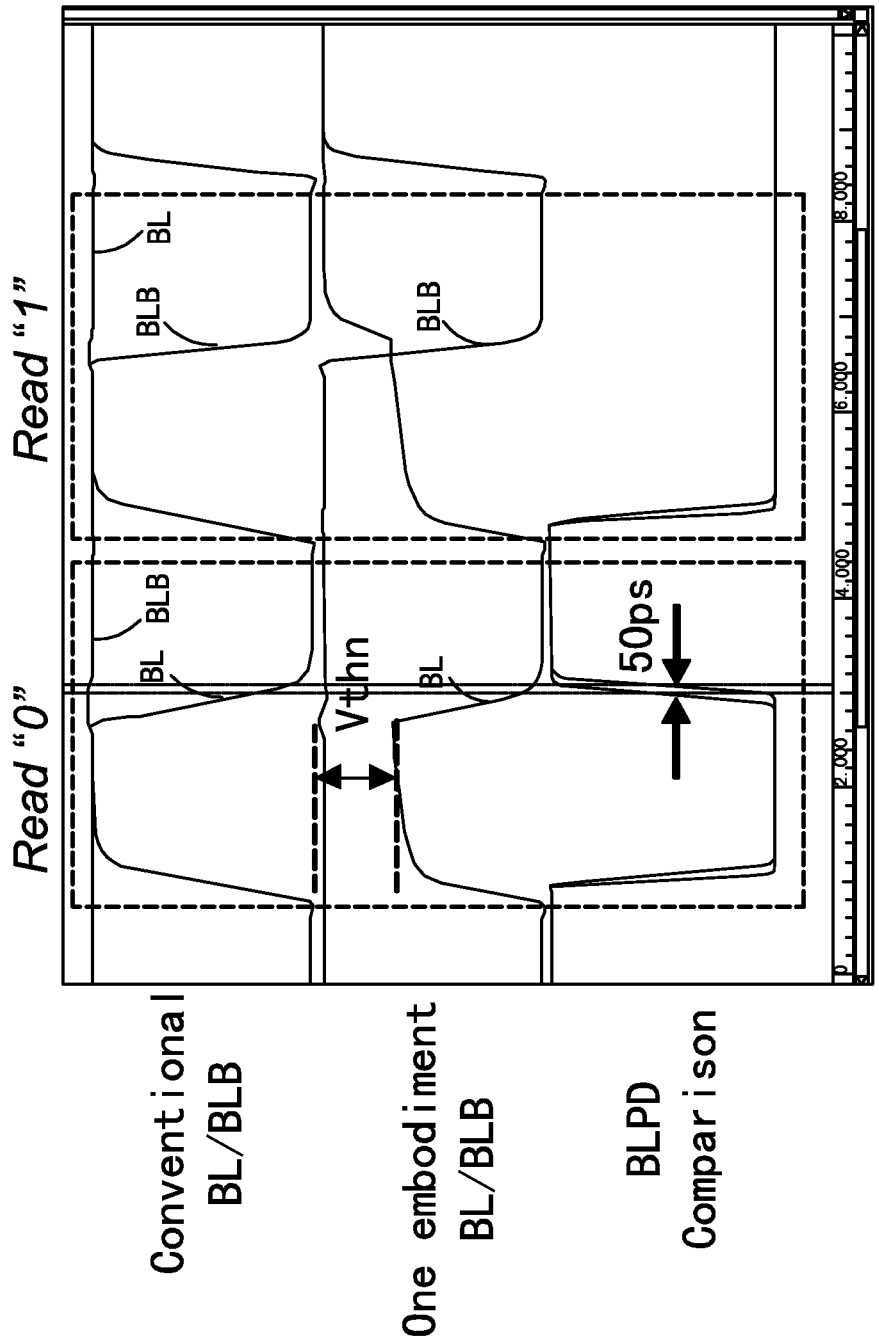
FIG. 3 is a plot showing simulated waveforms of the exemplary single-ended sensing scheme of FIG. 1 according to some embodiments.

FIG. 3 is a plot showing simulated waveforms of the exemplary single-ended sensing scheme of FIG. 1 according to some embodiments. The BL and BLB waveforms of a memory having full swing BL/BLB precharging scheme from VDD to ground or vice versa for reading operations are depicted for comparison. On the other hand, the BL waveform of one embodiment of the memory 100 shows precharging to (VDD−Vthn), then pulled down to the ground for the read "0" operation, and pulled up to VDD for the read "1" operation. The BLB waveform of the memory 100 does not show difference from the BL/BLB full-swing precharging configuration. The BLPD waveform comparison shows the reduced read/access time for the read "0" operation, e.g., 50 ps, for the memory 100 compared to the BL/BLB full-swing precharging configuration. The clock frequency of the memories was 1 GHz (a clock cycle is 1 ns).

Figure 4:
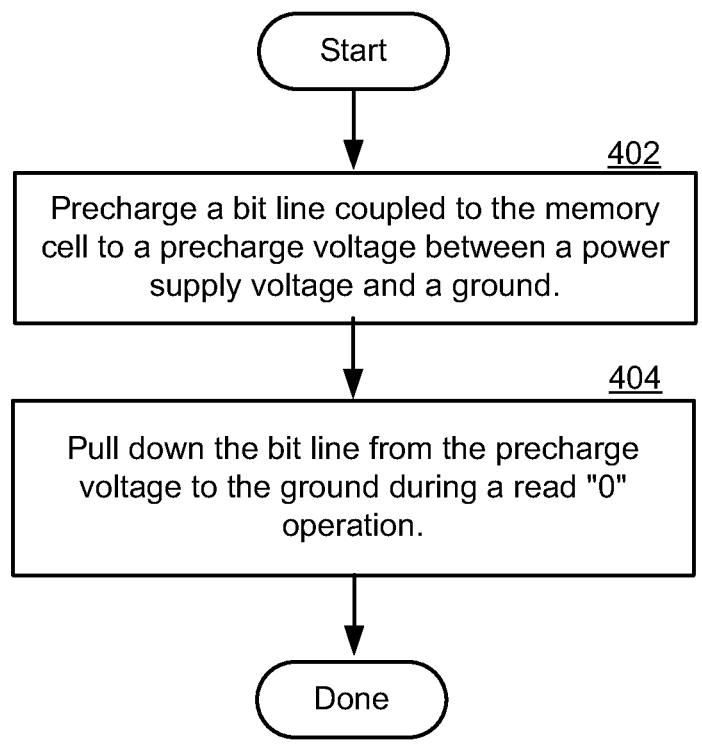
FIG. 4 is a flowchart for a method for the exemplary single-ended sensing scheme in FIG. 1 according to some embodiments.

FIG. 4 is a flowchart for a method for the exemplary single-ended sensing scheme in FIG. 1 according to some embodiments. The method embodiment described below shows exemplary steps, but they are not necessarily required to be performed in the order shown. Steps may be added, replaced, changed order, and/or eliminated as appropriate, in accordance with the spirit and scope of embodiment of the disclosure.

At step 402, a bit line, e.g., BL, coupled to the memory cell, e.g., 102, is precharged to a precharge voltage between a power supply voltage and a ground, e.g., VDD−Vthn. At step 404, the bit line is pulled down from the precharge voltage, e.g., VDD−Vthn (where Vthn is a threshold voltage of an NMOS transistor M2 in a precharge circuit 104a), to the ground during a read "0" operation.

In some embodiments, the method can include pulling up the bit line, e.g., BL, from the precharge voltage, e.g., VDD−Vthn, to the power supply voltage, e.g., VDD, during a read "1" operation. The method can further include controlling the NMOS transistor, e.g., M2, in a precharge circuit, e.g., 104a, utilizing a precharge signal applied to a precharge signal path, e.g., SEGUB. The method can further include precharging a bit line bar, e.g., BLB, coupled to the memory cell, e.g., 102, to the power supply voltage, e.g., VDD. The method can further include sensing the bit line, e.g., BL, using a NAND gate. The method can further include preventing a PMOS transistor, e.g., M6 or M7, in the NAND gate from turning on during precharging. For example, a voltage equal to the precharge voltage, e.g., VDD−Vthn, can be supplied to a source of the PMOS transistor, e.g., M6 or M7, during precharging.

According to some embodiments, a memory having a single-ended sensing scheme includes a bit line, a memory cell coupled to the bit line, and a precharge circuit. The precharge circuit is configured to precharge the bit line to a precharge voltage between a power supply voltage and a ground.

According to some embodiments, a method for reading a memory cell having a single-ended sensing scheme includes precharging a bit line coupled to the memory cell to a precharge voltage between a power supply voltage and a ground. The bit line is pulled down from the precharge voltage to the ground during a read "0" operation.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A memory having a single-ended sensing scheme, comprising:
   a bit line and a bit line bar;
   a memory cell coupled to the bit line and the bit line bar; and
   a precharge circuit configured to
      precharge the bit line to a precharge voltage lower than a power supply voltage and higher than a ground; and
      precharge the bit line bar to the power supply voltage;
   wherein the precharge circuit comprises an NMOS transistor configured to have the precharge voltage equal to the power supply voltage minus a threshold voltage of the NMOS transistor.

2. The memory of claim 1, wherein a drain of the NMOS transistor is coupled to the power supply voltage, a source of the NMOS transistor is coupled to the bit line, and a gate of the NMOS transistor is coupled to a precharge signal.

3. The memory of claim 1, wherein the precharge circuit further comprises a PMOS transistor.

4. The memory of claim 3, wherein a source of the PMOS transistor is coupled to the power supply voltage, a drain of the PMOS transistor is coupled to the bit line bar, and a gate of the PMOS transistor is coupled to a precharge signal path.

5. The memory of claim 1, further comprising a sensing circuit.

6. The memory of claim 1, further comprising a pull-up circuit comprising two cross-coupled PMOS transistors configured to pull up the bit line from the precharge voltage to the power supply voltage during performing a read "1" operation.

7. A memory having a single-ended sensing scheme, comprising:
   a bit line;
   a memory cell coupled to the bit line;
   a precharge circuit configured to precharge the bit line to a precharge voltage between a power supply voltage and a ground; and
   a sensing circuit;
   wherein the sensing circuit comprises a NAND gate having a first PMOS transistor, and a voltage control circuit configured to prevent the first PMOS transistor from turning on while the precharge circuit precharges the bit line.

8. The memory of claim 7, wherein a source of the first PMOS transistor has a voltage equal to the precharge voltage while the precharge circuit precharges the bit line.

9. The memory of claim 7, wherein the voltage control circuit comprises a second PMOS transistor controlled by a precharge signal.

10. The memory of claim 9, wherein the voltage control circuit further comprises a diode-connected transistor.

11. A method of reading a memory cell having a single-ended sensing scheme, comprising:
    precharging a bit line coupled to the memory cell to a precharge voltage lower than a power supply voltage and higher than a ground;
    precharging a bit line bar coupled to the memory cell to the power supply voltage; and
    selectively pulling down the bit line from the precharge voltage to the ground during performing a read "0" operation.

12. The method of claim 11, further comprising selectively pulling up the bit line from the precharge voltage to the power supply voltage during performing a read "1" operation.

13. The method of claim 11, wherein precharging the bit line comprises precharging the bit line to the power supply voltage minus a threshold voltage of an NMOS transistor in a precharge circuit.

14. The method of claim 13, further comprising controlling the NMOS transistor utilizing a precharge signal.

15. The method of claim 11, further comprising sensing the bit line using a NAND gate.

16. The method of claim 15, further comprising preventing a PMOS transistor in the NAND gate from turning on during precharging.

17. The method of claim 16, wherein preventing the PMOS transistor from turning on comprises supplying a voltage equal to the precharge voltage to a source of the PMOS transistor during precharging.

18. The memory of claim 8, further comprising:
    a bit line bar;
    wherein the precharge circuit comprises an NMOS transistor and a second PMOS transistor configured to precharge the bit line to the precharge voltage equal to the power supply voltage minus a threshold voltage of the NMOS transistor and precharge the bit line bar to the power supply voltage.

* * * * *